US006375749B1

(12) United States Patent
Boydston et al.

(10) Patent No.: US 6,375,749 B1
(45) Date of Patent: Apr. 23, 2002

(54) SUSCEPTORLESS SEMICONDUCTOR WAFER SUPPORT AND REACTOR SYSTEM FOR EPITAXIAL LAYER GROWTH

(75) Inventors: Mark R Boydston, Vancouver, WA (US); Gerald R. Dietze; Dominic A. Hartmann, both of Portland, OR (US)

(73) Assignee: SEH America, Inc., Vancouver, WA (US)

(*) Notice: Subject to any disclaimer, the term of this patent is extended or adjusted under 35 U.S.C. 154(b) by 0 days.

(21) Appl. No.: 09/567,659

(22) Filed: May 9, 2000

Related U.S. Application Data

(63) Continuation-in-part of application No. 09/353,197, filed on Jul. 14, 1999, and a continuation-in-part of application No. 09/353,796, filed on Jul. 14, 1999.

(51) Int. Cl.[7] .......... C23C 16/00
(52) U.S. Cl. .......... 118/728; 118/729; 118/730
(58) Field of Search .......... 118/725, 728, 118/729, 730

(56) References Cited

U.S. PATENT DOCUMENTS

| | | | | |
|---|---|---|---|---|
| 4,468,260 A | | 8/1984 | Hiramoto | 148/1.5 |
| 4,533,820 A | | 8/1985 | Shimizu | 219/411 |
| 4,540,876 A | | 9/1985 | McGinty | 219/405 |
| 4,821,674 A | | 4/1989 | deBoer et al. | 118/666 |
| 5,002,630 A | | 3/1991 | Kermani et al. | 156/610 |
| 5,044,943 A | | 9/1991 | Bowman et al. | 432/121 |
| 5,108,792 A | | 4/1992 | Anderson | |
| 5,156,820 A | | 10/1992 | Wong et al. | 422/186.05 |
| 5,224,503 A | | 7/1993 | Thompson et al. | 134/95.2 |
| 5,332,442 A | * | 7/1994 | Kubodera et al. | 118/725 |
| 5,421,893 A | | 6/1995 | Perlov | 118/725 |
| 5,489,341 A | | 2/1996 | Bergman et al. | 134/26 |
| 5,493,987 A | | 2/1996 | McDiarmid et al. | 117/102 |
| 5,500,081 A | | 3/1996 | Bergman | 156/646.1 |
| 5,584,310 A | | 12/1996 | Bergman et al. | 134/95.1 |
| 5,707,485 A | * | 1/1998 | Rolfson et al. | 156/643.1 |
| 5,762,751 A | | 6/1998 | Bleck et al. | 156/345 |
| 5,803,977 A | | 9/1998 | Tepman et al. | |
| 5,846,073 A | | 12/1998 | Weaver | 432/241 |
| 5,863,843 A | | 1/1999 | Green et al. | 438/771 |
| 5,895,596 A | | 4/1999 | Stoddard et al. | 219/497 |
| 5,904,478 A | | 5/1999 | Weaver et al. | 432/241 |
| 5,908,292 A | | 6/1999 | Smith et al. | 432/197 |
| 5,951,775 A | | 9/1999 | Tepman | 118/729 |
| 5,958,198 A | * | 9/1999 | Banholzer et al. | 204/298.15 |

(List continued on next page.)

FOREIGN PATENT DOCUMENTS

| | | |
|---|---|---|
| JP | 04091427 | 3/1992 |

OTHER PUBLICATIONS

Webster's New Collegiate Dictionary, copyright 1975, p. 887.

Advanced Semiconductor Materials, Reactor Section.

*Primary Examiner*—Jeffrie R. Lund
(74) *Attorney, Agent, or Firm*—Alston & Bird LLP

(57) ABSTRACT

A reactor system with an associated wafer support device is provided for use in the growth of an epitaxial layer of semiconductor material on a semiconductor wafer. The reactor system includes a reaction chamber including an inlet and an outlet configured to flow a source gas through the reaction chamber. The reaction system also includes a wafer support mounted at least partially within the reaction chamber, and a semiconductor wafer supported adjacent an outer edge by the wafer support. The wafer support device typically includes a hub and an arm extending outwardly from the hub. The wafer support device also typically includes a contact member coupled to the arm. In some embodiments a portion of the contact member extending downward relative to the back side of the wafer. The downwardly extending portion is configured to contact and support the wafer during epitaxial growth of semiconductor material onto the wafer.

21 Claims, 8 Drawing Sheets

U.S. PATENT DOCUMENTS

| | | | | |
|---|---|---|---|---|
| 5,972,116 A | | 10/1999 | Takagi | |
| 6,051,512 A | * | 4/2000 | Sommer et al. | 438/795 |
| 6,053,982 A | | 4/2000 | Halpin et al. | 118/728 |
| 6,086,680 A | | 7/2000 | Foster et al. | 118/725 |
| 6,121,061 A | * | 9/2000 | Van Bilsen et al. | 438/14 |
| 6,173,116 B1 | * | 1/2001 | Roozeboom et al. | 392/416 |

* cited by examiner

SUSCEPTORLESS SEMICONDUCTOR WAFER SUPPORT AND REACTOR SYSTEM FOR EPITAXIAL LAYER GROWTH

CROSS REFERENCE TO RELATED APPLICATIONS

This application is a continuation-in-part of application Ser. No. 09/353,796 filed Jul. 14, 1999 and application Ser. No. 09/353,197 filed Jul. 14, 1999, the disclosures of which are herein incorporated by reference.

TECHNICAL FIELD

The present invention relates generally to semiconductor wafer fabrication, and more specifically to a reactor system and wafer support for use during epitaxial growth of a semiconductor material on a semiconductor wafer.

BACKGROUND OF THE INVENTION

In the semiconductor wafer manufacturing industry, thin epitaxial layers of semiconductor material, such as silicon or gallium arsenide, are grown on a surface of a semiconductor wafer. These epitaxial layers, commonly referred to as epilayers, form the material within which many modern integrated circuits are fabricated. In addition, many other devices, including optoelectric sensors, light emitting diodes, and micromachined mechanical devices, may be fabricated from epilayer material. As epilayers are a fundamental building block for many technologies, is critical that they be manufactured as efficiently and defect-free as possible, to reduce the cost and increase the quality of the epilayer.

Epilayers may be grown according to a variety of methods, including molecular beam epitaxy (MBE), vapor phase epitaxy (VPE), and liquid phase epitaxy (LPE). In a vapor phase epitaxial reactor, epilayer semiconductor constituents, such as silicon, gallium, arsenic, and germanium, and various dopants such as boron, phosphorous, arsenic, and antimony, are transported to the substrate surface as volatile species suspended in a vapor. Typically, the species are adsorbed onto the substrate at high temperature and diffuse across the surface to form the epilayer.

The VPE process takes place in a reactor including a heat energy source, such as radio frequency (RF) coils or heat lamps, and a susceptor. The susceptor typically is a solid graphite disk underlying and extending to the edge of the wafer and is substantially thicker than the wafer. One or more wafers are placed into the reactor directly on the susceptor, and the heat energy source is activated to heat the susceptor and the wafer. Where a RF heat energy source is used, the susceptor absorbs RF heat energy and conducts heat energy to the wafer. Where heat lamps are used, the susceptor absorbs heat energy and evenly distributes heat within the wafer, making the wafer less susceptible to temperature gradients within the reaction chamber.

After the wafer has been heated, gas containing the semiconductor constituents for epitaxial growth is introduced to the reactor through an inlet and flowed toward the wafer. Constituents are deposited on the front side of the wafer to form the epilayer. However, contact between the susceptor and the wafer inhibits gas flow to the back side of the wafer, such that constituents do not reach the back side and epilayer growth does not occur on the back side.

Several problems exist with reactors having susceptors. First, the thermal mass of the susceptor must be heated within the reactor along with the wafer before the epitaxial growth process may begin. For each wafer, it is common for the reaction chamber to be heated and cooled several times during the epitaxial growth cycle. For example, after a silicon wafer is inserted into the reaction chamber, the temperature is typically raised for a hydrogen bake of the wafer, which removes silicon dioxide contaminants from the wafer. The chamber is then cooled for epilayer deposition, and is again cooled before unloading of the wafer. After deposition, the chamber typically is heated again, and etch gases, such as hydrogen chloride, are flowed through the chamber to remove semiconductor material from the chamber and susceptor.

When producing epitaxial wafers on a mass scale, heating up and cooling down the susceptor consumes significant amounts of time and energy. In addition, the susceptors require frequent cleaning as semiconductor materials build up on the surface of the susceptors during the epitaxial growth process. Without cleaning, deposits may flake off and contaminate the epilayer growth process. In addition, susceptors must be replaced as their surfaces degrade from repeated epilayer deposition and cleaning, further increasing the materials costs associated with wafer manufacture.

Use of a susceptor for epilayer growth also may induce thermal stresses within the wafer. For example, where RF coils are used to heat the susceptor, the back side of the wafer adjacent the susceptor typically will be hotter than the front side of the wafer during epilayer growth, causing the wafer to bow. Thermally induced strain will develop in the lattice of the bowed wafer as the wafer cools.

Compared to other fabrication procedures, epilayer growth takes place under closely controlled conditions. A prior step in the wafer manufacture process may leave contaminants or imperfections on the surface of the wafer. One effect of the epilayer growth process is to remove these contaminants and correct these imperfections. However, reactors that grow an epilayer on only one side of a wafer, such as reactors that use susceptors, do not remove contaminants or perfect the imperfections on the back side of the wafer. These imperfections and contaminants on the back side may adversely affect a downstream circuit fabrication, test, or measurement procedure.

Where only the front side of a wafer is being coated with an epilayer, there is a risk that dopants within the substrate of the wafer will escape from the back side of the substrate at high temperatures during the epitaxial growth process, enter the gas flow, and contaminate the epilayer growth process on the front side of the wafer. This contamination process is referred to as autodoping, and is highly undesirable.

In addition, use of a susceptor in a reactor requires that the wafer be loaded onto the susceptor by a paddle that picks the wafer up by its top side. Some current reactors commonly utilize paddles that lift the wafer by creating a vacuum through direct suction or according to the Bernoulli effect. Loading and unloading through such vacuum operative paddles is slow, and consumes valuable cycle time per wafer.

SUMMARY OF THE INVENTION

A reactor system with an associated wafer support device is provided for use in the growth of an epitaxial layer of semiconductor material on a semiconductor wafer. The reactor system includes a reaction chamber including an inlet and an outlet configured to flow a source gas through the reaction chamber. The reaction system also includes a wafer support mounted at least partially within the reaction chamber, and a semiconductor wafer supported adjacent an outer edge by the wafer support. The wafer support device typically includes a hub and an arm extending outwardly from the hub. The wafer support device also typically includes a contact member coupled to the arm. In some embodiments a portion of the contact member extending downward relative to the back side of the wafer. The downwardly extending portion is configured to contact and support the wafer during epitaxial growth of semiconductor material onto the wafer. The contact member may be triangular or circular in cross section, and may be coupled to the arm via an upwardly extending support member and coupling member. In addition, the wafer support may include a hub and at least three arms extending radially outward from the hub. The wafer support may also include at least three contact members, each contact member being coupled to a respective arm. Each contact member includes a respective tip configured to directly contact the back side of the wafer adjacent an outer edge of the wafer and to support the wafer in a substantially horizontal orientation within the reactor system. The wafer support does not include a susceptor.

DETAILED DESCRIPTION AND BEST MODE FOR CARRYING OUT THE INVENTION

Figure 1:
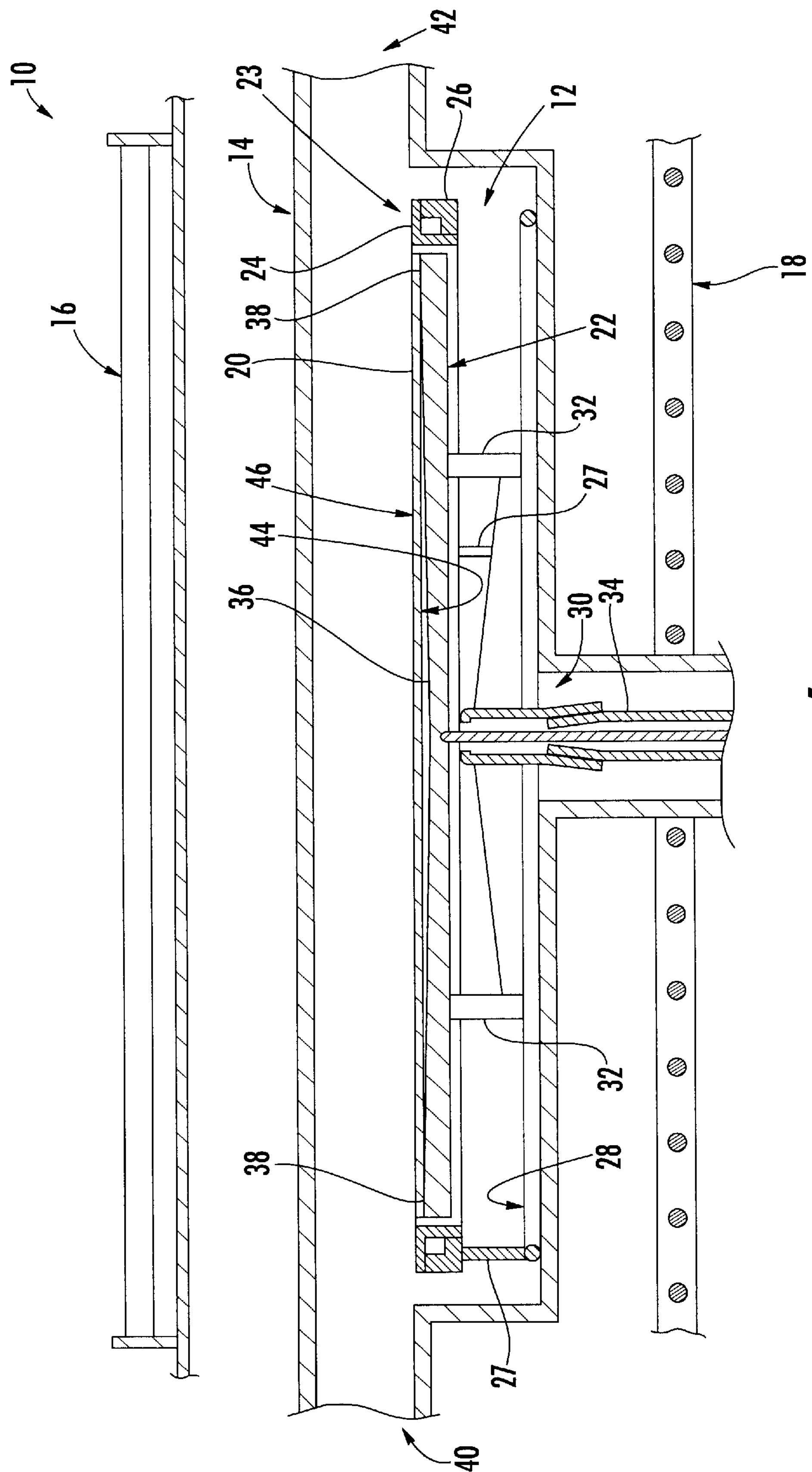
FIG. 1 is a cross-sectional view of a prior art epitaxial reactor including a susceptor.

Referring initially to FIG. 1, a prior art epitaxial reactor is shown generally at 10, including a susceptor assembly shown at 12. Prior art reactor 10 includes a reaction chamber 14 flanked on an upper side by an upper heat lamp array 16 and on a lower side by a lower heat lamp array 18. Susceptor assembly 12 is positioned within reaction chamber 14, and is configured to support semiconductor wafer 20 within reaction chamber 14.

Figure 2:
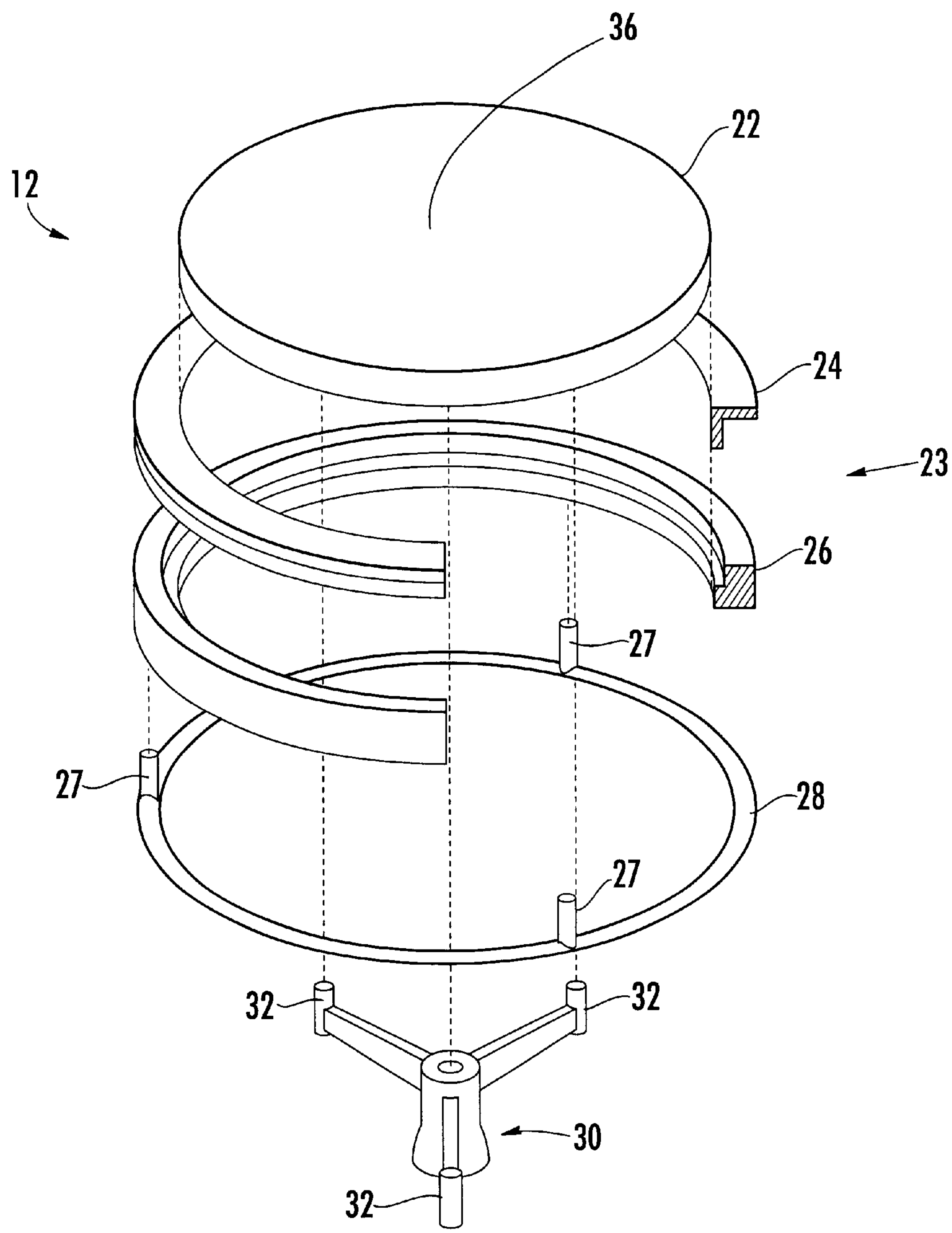
FIG. 2 is a partial cutaway exploded perspective view of a susceptor assembly of the prior art epitaxial reactor of FIG. 1.

As shown in FIGS. 1 and 2, susceptor assembly 12 includes several components, each of which must be heated by the upper and lower heat lamp arrays as the reaction chamber is heated to a process temperature. Susceptor assembly 12 includes a susceptor 22, typically of graphite construction, which acts to absorb heat energy from lamps 16, 18 and to evenly distribute the heat energy to wafer 20 during epitaxial deposition. Susceptor 22 typically includes a depression 36 on its top surface. During epilayer growth, wafer 20 rests upon the susceptor, contacting the susceptor only at an outer edge 38 of the susceptor. As shown in FIG. 1, susceptor 22 rests directly upon posts 32 of tripod 30. Tripod 30 rests upon shaft 34, which is configured to rotate under the influence of a prime mover (not shown).

In operation, the reaction chamber is heated to a process temperature and a source gas containing semiconductor constituents is flowed from inlet 40 to outlet 42, across a front side 46 of wafer 20 on its way through the reaction chamber. Typically, the semiconductor constituents are adsorbed onto the wafer surface at high temperature and diffuse across the surface to form the epilayer.

In prior art reactors such as 10, a susceptor is used to distribute heat to the wafer evenly. Epilayer growth is most uniform when an even temperature is maintained across the entire wafer. In addition, susceptor 22 inhibits epilayer growth on the backside of the wafer by mechanically inhibiting gas flow to the back side of the wafer.

Susceptor assembly 12 also includes a structure called a Saturn ring 23, including mating L-shaped rings 24 and 26, each typically of graphite. Saturn ring 23 is supported on posts 27 of Saturn ring support 28, and is positioned around susceptor 22 such that the susceptor is free to rotate within the Saturn ring.

Saturn ring 23 is used to insulate and control heat transfer at an outer edge of the wafer. Reactors with susceptors typically experience cooling along the perimeter of the wafer due to heat loss to the gas flow. The Saturn ring absorbs heat energy from the heat sources and helps prevent heat loss at the perimeter of the wafer, thereby keeping the temperature more uniform across the wafer and facilitating uniform epilayer growth.

However, susceptor 22, Saturn ring 23, and Saturn ring support 28 add thermal mass to the reaction chamber. For each wafer, these components must be heated and cooled multiple times during the epilayer growth process. In addition, these components periodically must be cleaned and/or replaced when deposits accumulate on the components from the epitaxial growth process. Therefore, use of these susceptor assembly components consumes great amounts of energy, time, and replacement materials.

Figures 3, 4:
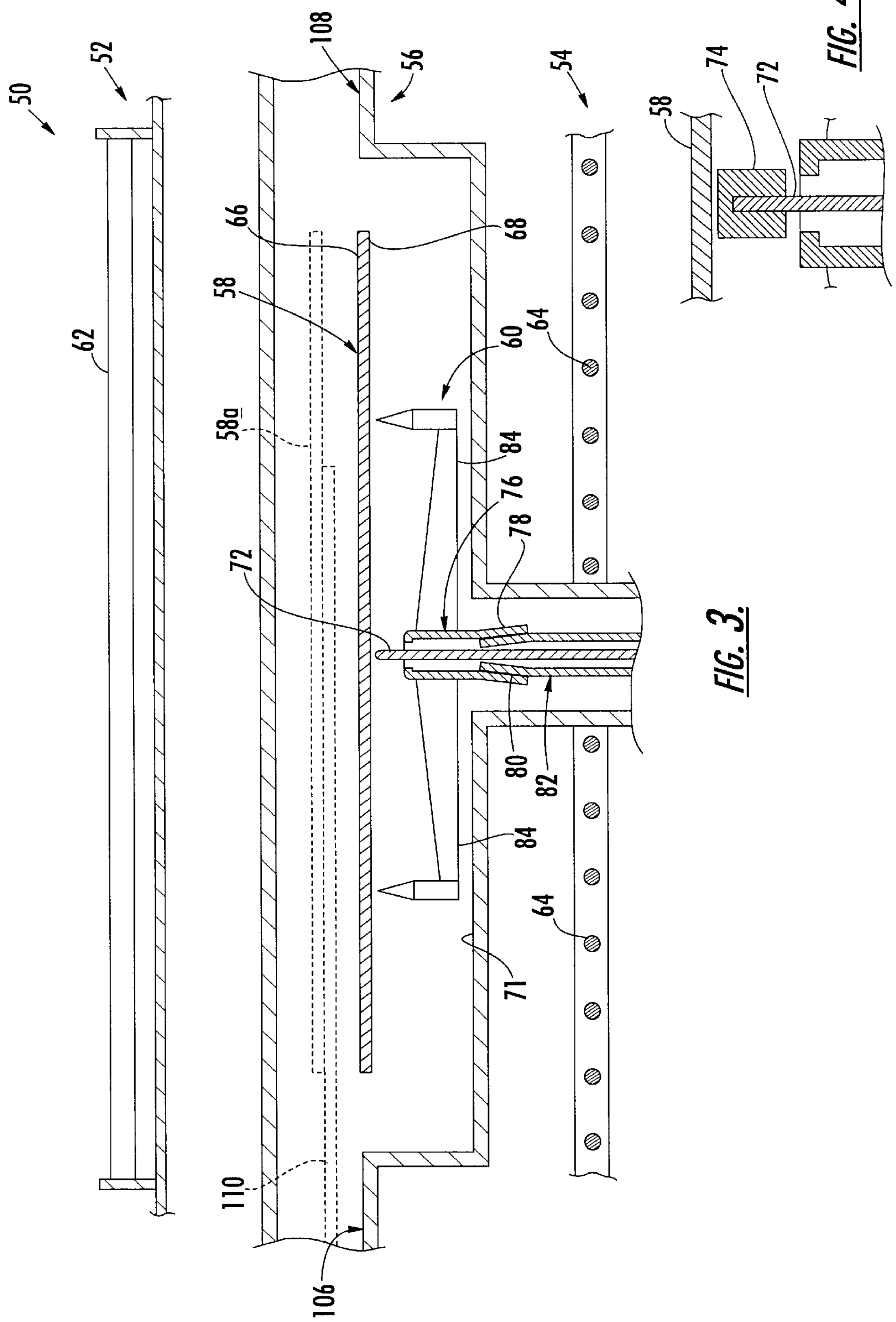
FIG. 3 is a cross-sectional view of a reactor system according to the present invention.
FIG. 4 is a cross-sectional view of another embodiment of a reactor system according to the present invention.

Turning now to FIG. 3, an epitaxial reactor system according to the present invention is shown generally at 50. Reactor system 50 includes an upper heat energy source 52 and a lower heat energy source 54 positioned on opposing sides of a reaction chamber 56. Typically, upper heat energy source 52 includes a plurality of heat lamps 62 positioned in an array extending across the top of reaction chamber 56, and lower heat energy source 54 includes a plurality of heat lamps 64 positioned in an array rotated 90 degrees from heat lamps 62 and extending across the bottom of reaction chamber 56. Alternatively, the upper and lower heat energy sources may be RF coils, or another type of heat source. Wafer 58 is heated by heat energy radiating from the upper heat source directly to a front side 66 of the wafer, and from the lower heat energy source directly to a back side 68 of the wafer.

A wafer 58 is positioned directly on a wafer support 60 within reaction chamber 56 during epilayer growth. Wafer support 60 includes a hub 76, which in turn includes a flared portion 78 configured to receive a tapered portion 80 of a shaft 82. Alternatively, hub 76 may incorporate another fastening mechanism to connect to shaft 82, or may be formed integral with shaft 82. Typically, shaft 82 is connected at a lower end to a rotation and translation mechanism (not shown) that is configured to rotate, raise, and lower the shaft and wafer support within the reaction chamber. Rotation of the wafer ensures that radiant heat energy and source gases containing reactants are evenly distributed to all regions of the wafer. Alternatively, the shaft and wafer support may be configured only to rotate, or move up or down, or the shaft and wafer support may not move at all.

Figure 5:
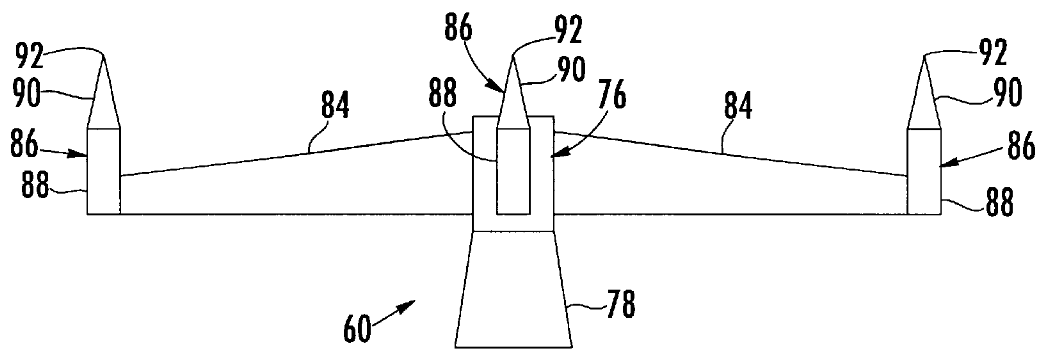
FIG. 5 is a front view of a wafer support according to the present invention.
Figure 6:
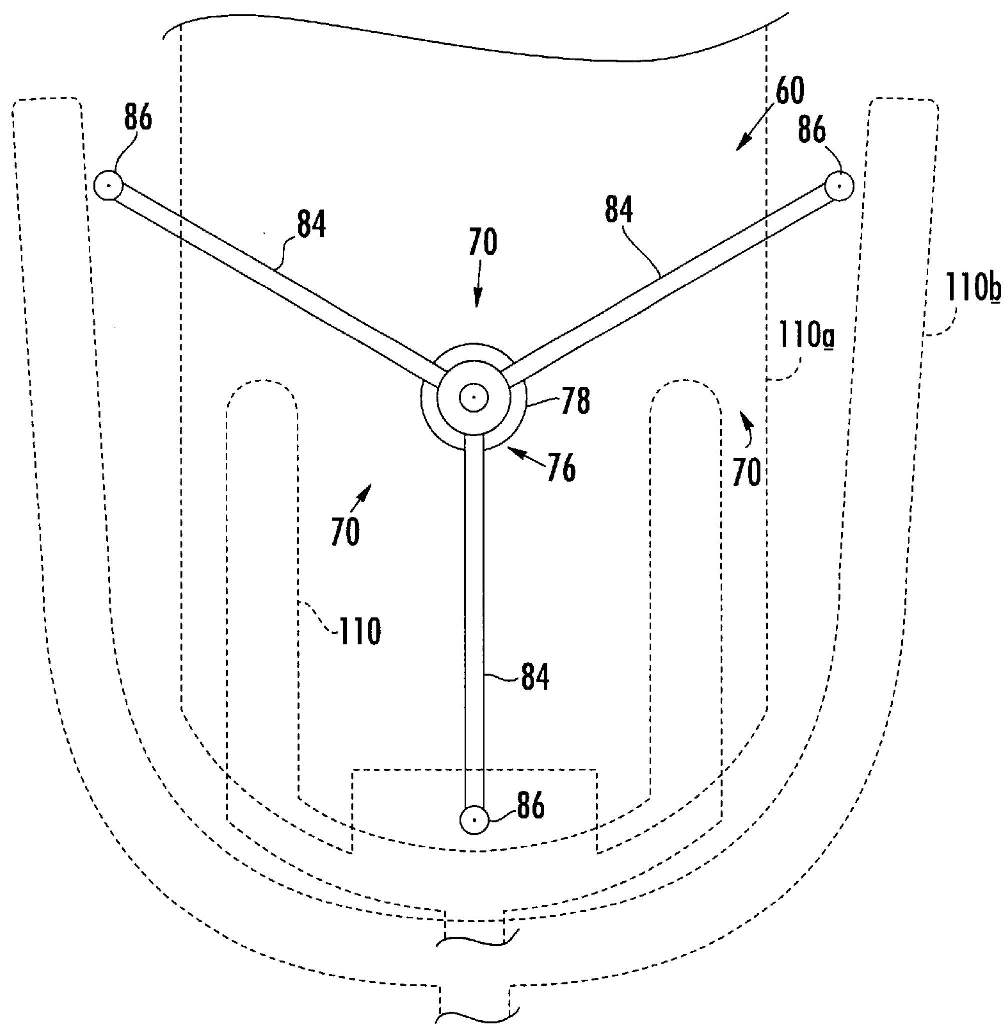
FIG. 6 is a top view of the wafer support of FIG. 5.

Wafer support 60 also includes arms 84 mounted at an inward end to hub 76 and extending radially outward from the hub, as shown in FIGS. 5 and 6. Typically arms 84 extend linearly outward at right angles from the hub. Alternatively, arms 84 may extend outward in a curved, spiraling, angled, or other fashion. Typically wafer support 60 includes three arms. Alternatively, a different number of arms may be employed, such as one arm, or five arms. If one arm is used, that arm may support, for example, a curved member that extends sufficiently around a perimeter of the wafer to support the wafer.

Arms 84 usually are connected at a distal end to contact members 86. Alternatively, contact members 86 may be connected to arms 84 at some other location, such as intermediate the inward end and distal end of arms 84. Typically, one contact member 86 is positioned on each arm 84. Alternatively, a plurality of contact members may be positioned on a single arm.

As shown in FIG. 6, wafer support 60 includes voids 70 disposed adjacent arms 84. Where wafer 58 is positioned for epilayer growth on wafer support 60 within reaction chamber 56, voids 70 typically extend from back side 68 of wafer 58 to a bottom 71 of the reaction chamber. Voids 70 are configured to facilitate gas flow to back side 68 of wafer 58. In addition, voids 70 are configured to allow heat energy to radiate from lower heat energy source 54, through the bottom 71 of the reaction chamber, through the voids 70, directly to the back side 68 of wafer 58, without being absorbed by an interfering susceptor or wafer support structure. Typically, reaction chamber 56, including bottom 71, and wafer support 60 are made of quartz, and are substantially thermally transparent, allowing radiant heat energy to pass directly through their structures.

Contact members 86 each typically include a shaft 88 and a tip 90 adjacent an upper end of the shaft. Each tip 90 typically includes a taper terminating in a point 92. The taper of contact members 86 is usually linear, extending inward towards a central longitudinal axis of the shaft at a 30 degree angle from the vertical axis. Alternatively, the taper may be of another angle, such as 45 degrees, or may be curved or some other irregular shape. For example, the tip may be hemispherical or elliptical. Point 92 is typically fire polished and formed with a radius of 0.5 millimeters or less.

Figure 7:
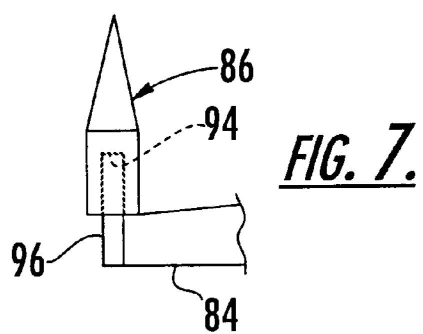
FIG. 7 is a partial view of another embodiment of a contact member according to the present invention.
Figure 8:
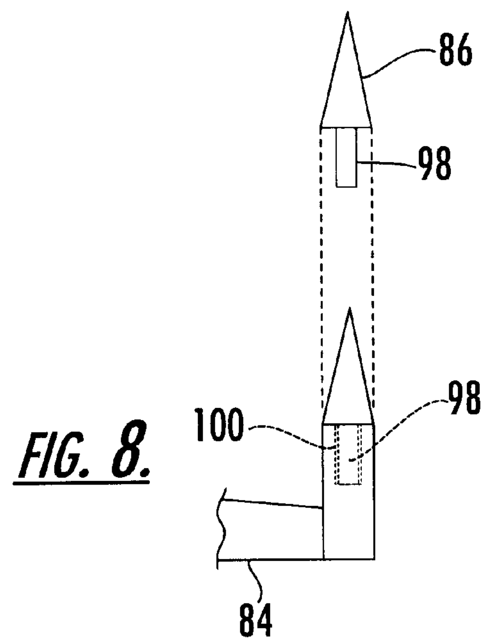
FIG. 8 is a partial view of yet another embodiment of a contact member of according to the present invention.
Figure 9:
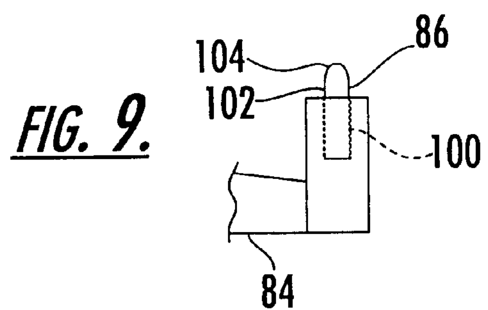
FIG. 9 is a partial of view of yet another embodiment of a contact member according to the present invention.

Tip 90 and shaft 88 may be formed as an integral structure, as shown in FIG. 5. Alternatively, the contact member and arm may be separable. As shown in FIG. 7, contact member 86 may include a recess or hole 94 configured to mount upon a projection or post 96 of arm 84. In addition, as shown in FIG. 8, contact member 86 may include a projection or post 98 configured to mount in a recess or hole 100 of arm 84. As shown in FIG. 9, contact member 86 may include a shaft 102 that is taller than hole 100, and which terminates in a tip 104.

In the embodiments shown in FIGS. 7–9, the contact member is removable from the arm and replaceable, such as may be required when deposits from the epi process build up on the surface of the contact member. The contact member is often made of quartz, such that deposits do not easily build up on the contact member and radiant heat energy may easily pass through the contact member. Alternatively a portion or the entirety of the contact member may be formed of some other material, such as carbide.

Contact members 86 typically are configured with each tip 90 terminating in a point 92 such that minimum contact with wafer 58 is made during epilayer growth. Because the epilayer growth process is extremely sensitive to changes in wafer temperature, it is desirable to minimize contact with the wafer. Contact with the wafer will result in conductive heat transfer between the wafer and contact member. Conduction will result in a temperature gradient in the wafer that produces imperfect or uneven epilayer growth. In addition, the contact member may interfere in radiation of heat energy from the lower heat energy source to the wafer, thereby causing a region of the wafer to receive less heat energy, and be cooler, than surrounding regions. This interference will result in changes in epilayer growth in the cooler portion, thereby producing a heat shadow in the resultant epilayer. Such a heat shadow may interfere with later circuit fabrication in the epilayer, and is undesirable.

Alternatively, one or more contact members may not terminate in a point, but may take some other shape, such as a ring or curved section. For example, the wafer support may include a single ring-shaped contact member supporting the wafer near its outer edge, a single arm extending from the central hub to support the ring-shaped contact member, and a void adjacent the single arm extending to the bottom of the reaction chamber.

Reaction chamber 56 further includes an inlet 106 and an outlet 108. The inlet is configured to receive a gas mixture from a gas source (not shown) and direct the flow of the gas mixture around wafer 58 to outlet 108. Outlet 108 is configured to transport the gas mixture to an exhaust system (not shown). Typically, the gas mixture includes a source gas containing epilayer semiconductor constituents, such as silicon, gallium, arsenic, and germanium. The gas mixture may also include a dopant gas including a dopant constituent, such as boron, phosphorous, arsenic, or antimony. These semiconductor and dopant constituents are transported to the wafer surface as volatile species suspended in the gas mixture. Typically, the constituents are adsorbed onto the substrate at high temperature and diffuse across the surface to form the epilayer.

Where it is desired to etch material from the wafer 58, wafer support 60, or reaction chamber 56, the gas mixture may also include an etch gas, such as hydrogen chloride. It is also common for the gas mixture to include a carrier gas, such as hydrogen, which does not react with the wafer, but acts as a diluent within the gas mixture.

Inlet 106 and outlet 108 are horizontally disposed on opposite sides of reaction chamber 56, and wafer support 60 is configured to hold wafer 58 intermediate the inlet and the outlet, such that the gas mixture flows from the inlet, around the wafer, and to the outlet. During this gas flow, the gas mixture flows to each of the front side 66 and the back side 68 of the wafer. The wafer may be raised or lowered within the reaction chamber to adjust gas flow around the wafer; for example, the wafer may be raised to increase gas flow to the back side of the wafer. To reach the back side of wafer 58, the gas mixture flows through the voids 70 in wafer support 60.

Figure 10:
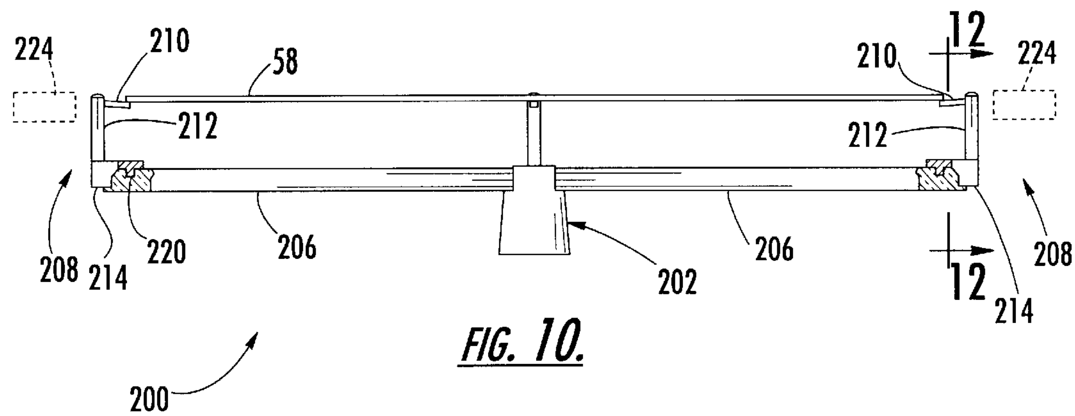
FIG. 10 is a side view of a wafer support according to another embodiment of the present invention.
Figure 11:
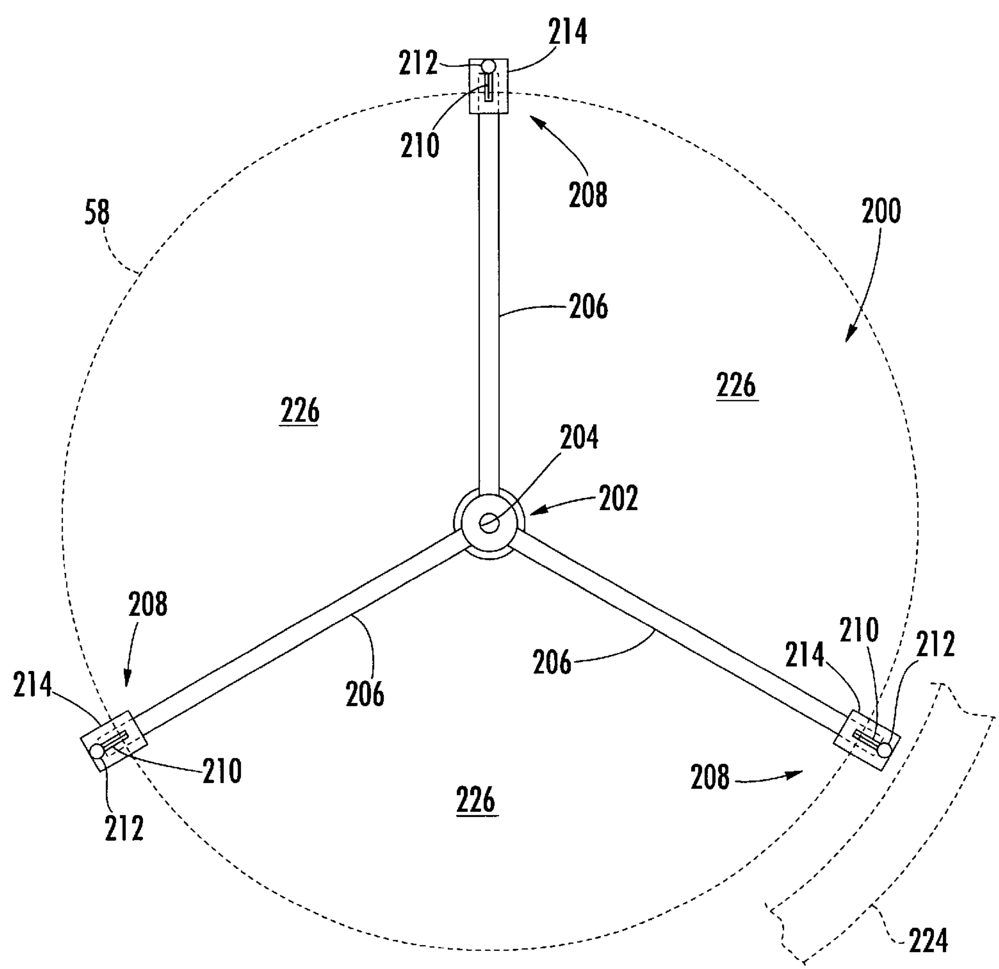
FIG. 11 is a top view of the wafer support of FIG. 10.

In FIGS. 10 and 11, a wafer support according to an another embodiment of the present invention is shown generally at 200. Wafer support 200 includes a hub 202 that is flared and configured to mount to shaft 82 of the above described reactor system 50. Shaft 82 supports and rotates the wafer support within the reaction chamber 56, described above. A hole 204 is provided in the top of hub 202, through which a thermocouple such as thermocouple 72, described below, may be placed.

Figure 12:
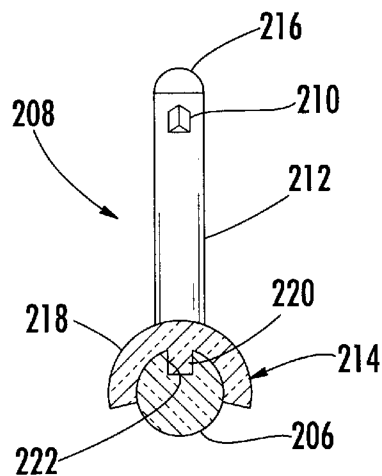
FIG. 12 is a partial cross-sectional view of an arm and contact member of the wafer support of FIG. 10.

Wafer support 202 further includes three arms 206 extending radially outward from the hub. Alternatively, a smaller or greater number of arms may be provided. Arms 206 are typically circular in cross section, as shown in FIG. 12. The top of the hub is typically formed horizontally flush with the top of the arms. Typically, the arms extend outward at right angles from the hub. However, it will be appreciated that the arms may extend at another predetermined angle, and/or may curve or spiral outward. Wafer support 200 includes voids 226 positioned adjacent arms 206. Voids 226 are similar to voids 70 described above.

Wafer support 200 further includes a wafer contact assembly 208 coupled to each arm 206 adjacent a distal end of the arm. Each wafer contact assembly 208 includes a contact member 210 mounted to an upwardly extending support member 212, also referred to as post 212, which is in turn mounted to a respective arm 206 by a coupling member 214.

Figure 15:
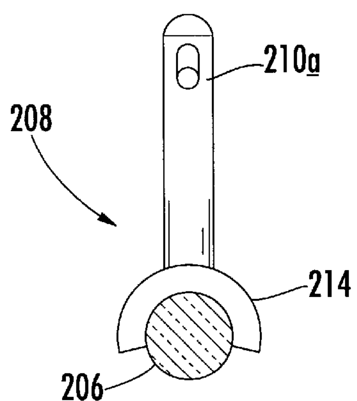
FIG. 15 is a partial cross-sectional view of an arm and contact member according to another embodiment of the present invention.

It is desirable to reduce the thermal mass of the contact member near the wafer, in order to reduce thermal interference that may cause abnormalities in the epilayer growth on the wafer, as described above. Thus, contact member 210 is formed of a shape with minimal surface area near the contact point with wafer 58. Typically, contact member 210 is triangular in shape, as shown in FIG. 12. Alternatively, contact member 210 may be cylindrical in shape, as shown at 210*a* in FIG. 15, or may be of some other suitable shape. Typically, the contact member is between about 0.02 and 0.20 inches in width, and preferably is about 0.06 inches in width, at its widest point.

Figure 14:
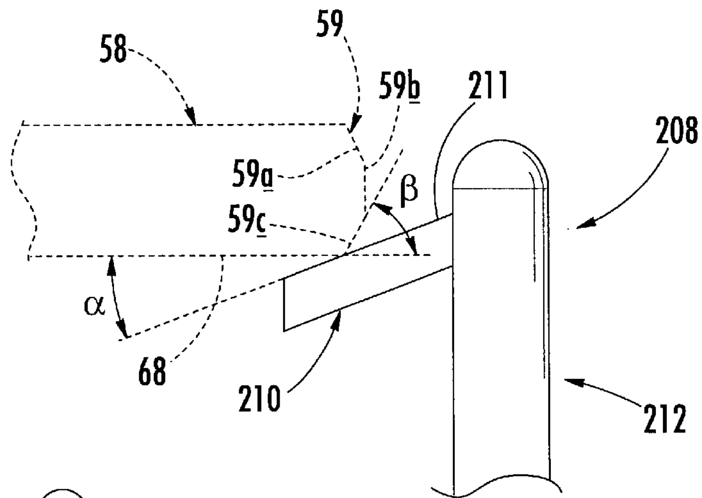
FIG. 14 is a detail side view of an arm and contact member of the wafer support of FIG. 10.

As shown in FIG. 14, contact member 210 typically extends inwardly and downwardly from post 212. The contact member extends downward from a point above the bottom surface 68 of wafer 58 to a point below the bottom surface 68 of the wafer. Contact member 210 includes a downwardly sloping top surface portion 211 that is configured to contact an outer edge 59 of wafer 58. Outer edge 59 of wafer 58 typically includes top and bottom beveled portions 59*a* and 59*c*, and vertical portion 59*b*. The bevels are cut at an angle relative to the horizontal. The top surface portion 211 of contact member 210 is angled downward at an angle relative to the horizontal, such that angle is greater than zero degrees and less than angle. Thus, contact member 210 contacts the wafer 58 at one point of contact, thereby reducing the thermal interference caused by the wafer support on epilayer growth on the wafer.

Typically, angle is about 22 degrees, and angle is between about zero and 22 degrees. In one preferred embodiment of the invention, angle is between zero and 15 degrees. In another preferred embodiment of the invention, angle is between about zero and 10 degrees, and in a particularly preferred embodiment, angle is about 4 degrees. It has been found that in these ranges, the wafer tends to center itself upon the three contact members when dropped by a paddle or other loading device onto the contact members 210 of wafer support 200. The wafer vibrates slightly as it hits the contact members, and tends towards a centered position because of the inward slope of the contact members. Thus, successive wafers may be positioned in substantially the same position during the epilayer growth process, thereby assuring a uniform quality in the epilayers grown on the wafers.

Post 212 typically is mounted to coupling member 214 at a lower end and extends from a point below the bottom surface 68 of wafer 58 to a point above bottom surface 68 of the wafer. Post 212 typically includes a rounded top 216, which reduces interference in the gas flow to the outer edge 59 of wafer 58. In addition, post 212 is usually circular in cross section. Post 212 is typically positioned outward of the outer edge of the wafer.

Figure 16:
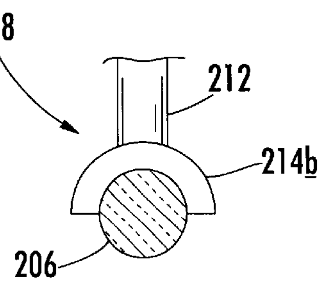
FIG. 16 is a partial cross-sectional view of an arm and contact member according to another embodiment of the present invention.

Coupling member 214 includes a semi-cylindrical member 218 that extends slightly more than 180 degrees around arm 206. The contact assembly is typically quartz, and limited inherent flexibility in this material enables the walls of the semi-cylindrical member 218 to be temporarily bent slightly outward to enable installation of semi-cylindrical member 218 onto arm 206. Alternatively, contact assembly 208 may include a coupling member 214*b* with a semi-cylindrical member that extends 180 degrees, or less, around arm 206, as shown in FIG. 16.

Figure 13:
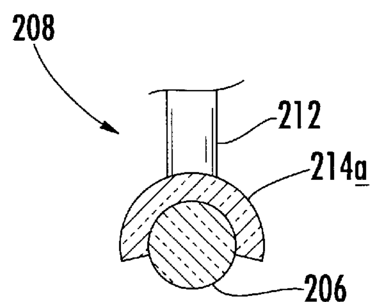
FIG. 13 is a partial cross-sectional view of an arm and contact member according to another embodiment of the present invention.

Coupling member 214 also typically includes a protrusion 220 extending from the semi-cylindrical member 218 into a slot 222 in the arm 206. The mating of protrusion 220 and slot 222 serve to secure coupling member 214 on arm 206. Alternatively, the contact assembly may include a coupling member 214*a* without any protrusion, as shown in FIG. 13. It will be understood that coupling member 214 also may be secured to arm 206 by interference fit, welding or fusing, or other suitable attachment method.

A heat absorbing ring 224 may also be placed around an outside edge of the wafer 58, adjacent an outer side of each of the wafer contact assemblies 208. The heat absorbing ring is typically at least as thick as the wafer 58. Typically the heat absorbing ring is made of graphite. Alternatively, another suitable material may be used. The heat absorbing ring serves to absorb and evenly distribute heat to the edge of wafer 58.

Figure 17:
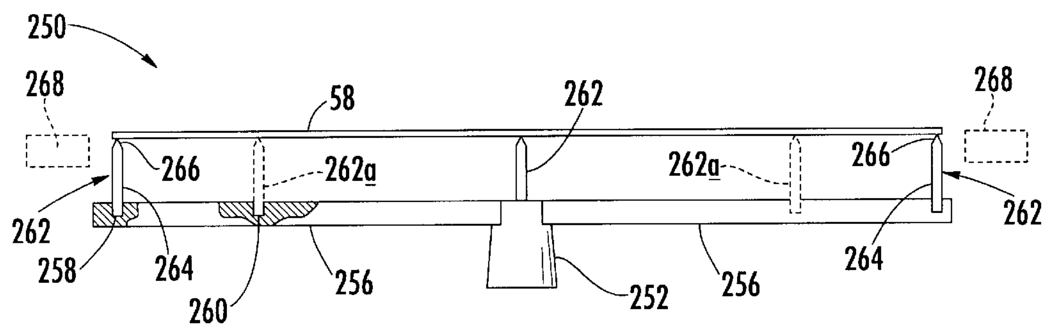
FIG. 17 is a side view of a wafer support according to another embodiment of the present invention.
Figure 18:
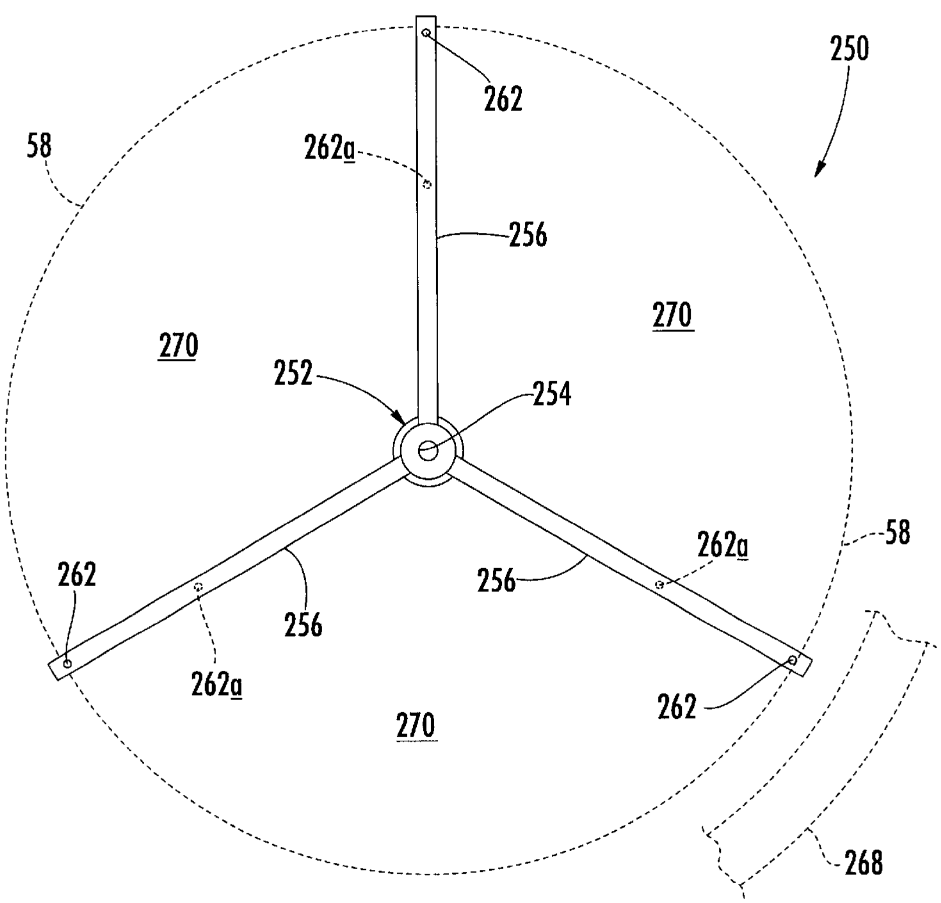
FIG. 18 is a top view of the wafer support of FIG. 17.

FIGS. 17 and 18 show another embodiment of a wafer support according to the present invention, indicated generally at 250. Wafer support 250 includes a hub 252 that is flared to receive shaft 82, such that the wafer support may be supported and rotated within reaction chamber 56, described above. Wafer support 250 further includes radially extending arms 256. Arms 256 typically extend at right angles from hub 252. Alternatively, arms 256 may extend from the hub at another predetermined angle, and may be spiraled or curved. Wafer support 250 includes voids 270 positioned adjacent arms 256. Voids 270 are similar to voids 70 described above. A hole 254 is positioned in the top of hub 252, through which a thermocouple such as thermocouple 72, described below, may be positioned.

Each of arms 256 typically includes an outer mount hole 258 positioned adjacent a distal end of the arm. Each of the arms also may include an inner mount hole 260 positioned intermediate the distal and proximate ends of the arm. Each of mount holes 258, 260 is adapted to receive a respective contact member 262. Preferably, the contact members are installed in outer mount holes 258 adjacent a distal end of each arm. Alternatively, contact members may be installed in inner mount holes 260, in positions shown in dashed lines at 262*a* intermediate the proximate and distal ends of each arm. In addition, contact members 262 may be installed in both holes 258 and 260, or in a combination of holes selected from among holes 258 and 260. It will also be appreciated that the contact members may be formed integrally with the arms, or may attach to the arms in another suitable manner, and the arms may not include mount holes.

Each contact member 262 includes a shaft 264 terminating in a tip 266. Tip 266 is typically a 45 degree cone. Alternatively tip 266 may be a cone of another predetermined angle, or may be rounded or polygonal. In an exemplary embodiment of the invention, shaft 264 is between about 0.02 and 0.20 inches in diameter, and is preferably about 0.06 inches in diameter. Alternatively, shaft 264 may have a larger or smaller diameter. Typically, contact member 262 is between about 0.5 and 2 inches in height. In one preferable embodiment of the invention, the shaft is between about 0.8 and 1.4 inches in height, and in one particularly preferable embodiment of the invention is about 1.2 inches in height. Alternatively, the contact member may be longer or shorter.

A heat absorbing ring 268 may also be placed around an outside edge of the wafer 58, adjacent an outer side of each of the contact members 262. The heat absorbing ring typically is at least as thick as the wafer 58, and is made of graphite. Alternatively, another suitable material may be used. The heat absorbing ring serves to absorb and evenly distribute heat to the edge of wafer 58.

The embodiments of FIGS. 10–18 have the advantage of being configured to support the wafer adjacent an outer edge of the wafer. This reduces imperfections to the underside of wafer caused by supporting the wafer by direct contact with the underside. When used in combination with a heat absorbing ring to stabilize heat transfer to the outer edge of the ring, fewer epilayer imperfections result. In addition, these embodiments utilize round arms, and a reduced-height hub, each of which minimizes material near the wafer, thereby reducing thermal interference in the epilayer growth process and improving gas flow to the underside of the wafer.

According to the present invention, a method may be practiced for susceptorless epitaxial growth of a layer of semiconductor material on a semiconductor wafer. The method includes placing wafer 58 within reaction chamber 56 and supporting the wafer directly on a contact member 86 of wafer support 60. The present method will be described with reference to wafer support 60, however it will be appreciated that wafer supports 200, 250 also may be used in connection with the method. The method further includes heating the wafer to a predetermined temperature without also heating a susceptor. Typically, the heat energy is radiated directly to a front and back side of the wafer.

The radiant energy passes through voids 70 in wafer support 60, shown in FIG. 6, directly to the back side of the wafer. The voids in wafer support 60 enable the heat energy source to heat the wafer without substantial structural interference by a susceptor or the wafer support. In addition, the voids decrease the thermal mass of the wafer support. Therefore, compared to prior reactors with susceptors, the present invention enables the wafer to be heated more directly and quickly.

Reaction chamber 56 is heated by heat energy sources 52, 54 until wafer 58 reaches a predetermined process temperature at which it is desired that epilayer growth occur. The process temperature typically is between 900 and 1200 degrees Celsius. The method may also include positioning a thermocouple 72 proximate wafer 58 to sense the temperature of the reaction chamber adjacent the wafer. To reduce thermal interference with the wafer, the thermocouple typically does not contact the wafer. As shown in FIG. 4, thermocouple 72 may be covered by a cap 74, typically of graphite material. Cap 74 absorbs heat energy and insulates thermocouple 72 such that the thermocouple is not subject to temporary temperature fluctuations caused, for example, by convection due to gas currents in the reaction chamber, and may measure more accurately the temperature adjacent the wafer. The thermocouple is used to control the amount of heat added to the reaction chamber, such that the temperature in the reaction chamber may be precisely controlled.

The method also includes flowing a source gas including semiconductor constituents across the wafer to facilitate epilayer growth on a surface of the wafer. Source gas is flowed through void 70 to reach the back side of the wafer. The method may also include flowing a dopant gas, etch gas, and/or carrier gas to a front and back side of the wafer, the gases reaching the back side through void 70. Typically, the gases are simultaneously flowed to the front and back side of the wafer. Alternatively, the gases may be flowed alternately to a front side and a back side of the wafer, or flowed only to one of the front or back sides of the wafer. Over time, deposits from the epilayer growth process build up on the components within reaction chamber 56. Such deposits may contaminate a growing epilayer, and must be removed periodically. The present invention may include removing the contact member from the wafer support and replacing the contact member. Typically, this is accomplished using a contact member as shown in FIGS. 7–9. The deposits may also be removed by flowing an etch gas through the reaction chamber.

To distribute heat energy and gases flowing through reaction chamber 56 to wafer 58 evenly, the method may include rotating the wafer within the reaction chamber during growth of the epitaxial layer. The method may also include moving the wafer up and down within the reaction chamber during growth of the epitaxial layer to adjust the heat and/or gas mixture reaching a region of the wafer.

The method may also include deposition of a gettering layer on the back side of the wafer during the epilayer deposition cycle. Gettering is a natural process by which defects in the crystal lattice attract impurities within the semiconductor material. The impurities are attracted to the defects due to the strain the defects create in the crystal lattice. As a result, impurities tend to precipitate around the defects. The method may include intentionally creating defects, or gettering sites, in the crystal lattice to attract contaminants away from the epilayer. For example, the method may include depositing a polysilicon layer on the back surface of the wafer to create strain within the crystal lattice.

The method may also include loading a wafer into the reaction chamber by an understructure, such as spatula 110, 110*a*, or 110*b*, shown in FIG. 6. During loading, the wafer is brought into the reaction chamber on the spatula, to a position indicated at 58*a* in FIG. 3. Wafer support 60 may then be moved up to raise the wafer off of spatula 110, at which time spatula 110 is withdrawn from the reaction chamber. Wafer support 60 then typically is lowered into position for epilayer growth. Mechanical loading of the wafer by such an understructure is less complex and significantly decreases loading time compared with vacuum loading mechanisms employed by reactors with susceptors. The method also may include centering the wafer on the wafer support by use of inwardly extending and downwardly sloping portions of contact members 210, as described above.

According to the present invention, epitaxial growth may occur in a reactor system without the susceptor 22, Saturn ring 23, or Saturn ring support 28 found on prior reactors. Therefore, the reaction chamber may be heated and cooled more quickly, with less energy, and epilayer growth may be achieved in a shorter cycle time per wafer, resulting in a finished epitaxial wafer of reduced cost. In addition, semiconductor deposition on reactor components and contamination therefrom is significantly reduced. It is believed that lower quantities of source gases are required by the present invention, because incidental deposition on other reactor components is reduced. In addition, the present invention may be used to prevent autodoping during the epilayer growth process, because an epilayer may be deposited on the back side of the wafer. Finally, direct, even heating of the wafer on both sides through the voids in the wafer support reduces thermal strain in the wafer experienced by reactors where heat transfer occurs between the wafer and a susceptor.

INDUSTRRIAL APPLICABILITY

This invention is applicable to the semiconductor processing industry, and particularly to epitaxial reactor systems for use in growing an epitaxial layer of semiconductor material on a semiconductor wafer.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A wafer support device to support a semiconductor wafer within a reactor system during epitaxial growth of a semiconductor material onto the wafer, the wafer including a back side, the wafer support device comprising:

a hub;

a plurality of arms extending outwardly from the hub; and a plurality of spaced-apart contact members, each contact member being coupled to a respective one of the arms, and each contact member including a portion configured to contact the back side of the wafer and to support the wafer during epitaxial growth of semiconductor material onto the wafer;

wherein the portion of each contact member extends downward relative to the back side of the wafer.

2. The wafer support device of claim 1, wherein the wafer includes an outer edge, and each of the contact members is configured to support the wafer adjacent the outer edge.

3. The wafer support device of claim 1, wherein the downwardly extending portion of each contact member extends downward at an angle of greater than zero and less than about 22 degrees relative to the back side of the wafer.

4. The wafer support device of claim 1, wherein the downwardly extending portion of each contact member extends downward at an angle of between zero and about 15 degrees relative to the back side of the wafer.

5. The wafer support device of claim 1, wherein at least one of the contact members includes a triangular cross section.

6. The wafer support device of claim 1, wherein at least one of the contact members includes a circular cross section.

7. The wafer support device of claim 1, wherein the downwardly extending portion of each contact member extends inwardly from above the back side of the wafer to below the backside of the wafer.

8. The wafer support device of claim 1, wherein the wafer includes an outer edge, and wherein each of the contact members is configured to contact and support the wafer adjacent the outer edge.

9. The wafer support device of claim 8, further comprising:

a plurality of upwardly extending support members, each upwardly extending support member being coupled at a lower end to a distal end of a respective arm and at an upper end to a corresponding contact member.

10. The wafer support device of claim 9, wherein each of the upwardly extending support members is positioned outside of the outer edge of the wafer.

11. The wafer support device of claim 9, wherein each of the upwardly extending support members extends from below the back side of the wafer to above the back side of the wafer.

12. The wafer support device of claim 9, further comprising:

a plurality of coupling members, each coupling member securing a respective upwardly extending support member to the distal end of a corresponding arm.

13. The wafer support device of claim 12, wherein at least one of the coupling members includes a semi-cylindrical base.

14. The wafer support device of claim 12, wherein at least one of the coupling members includes a protrusion, and the arm includes a hole adapted to receive the protrusion.

15. The wafer support device of claim 1, wherein the arm includes a circular cross section.

16. The wafer support device of claim 1, wherein the hub includes a top that is substantially horizontally flush with the arms.

17. The wafer support device of claim 1, wherein the plurality of arms includes three arms extending radially outward from the hub, and the plurality of contact members includes three contact members, each of the contact members being coupled to a respective arm, wherein a portion of each of the contact members extends downward relative to the back side of the wafer, each of the downwardly extending portions being configured to contact and support the wafer during epitaxial growth of semiconductor material onto the wafer.

18. The wafer support device of claim 17, wherein the downwardly extending portion of each contact member extends downward at an angle of between zero and about 22 degrees.

19. The wafer support device of claim 17, wherein the downwardly extending portion of each contact member extends downward at an angle of between zero and about 15 degrees.

20. A reactor system for use in growth of an epitaxial layer of semiconductor material on a semiconductor wafer, the reactor system comprising:

a reaction chamber including an inlet and an outlet configured to flow a source gas through the reaction chamber;

a wafer support mounted at least partially within the reaction chamber, the wafer support including at least three contact members, each contact member including a downwardly extending portion; and a semiconductor wafer supported within the reaction chamber by contact of the outer edge of the semiconductor wafer and downwardly extending portions of the three contact members.

21. The system of claim 20, further comprising:

a heat absorbing ring positioned adjacent the outer edge of the wafer and adjacent an outward side of each of the contact members.

* * * * *

UNITED STATES PATENT AND TRADEMARK OFFICE
CERTIFICATE OF CORRECTION

PATENT NO. : 6,375,749 B1
DATED : April 23, 2002
INVENTOR(S) : Boydston et al.

It is certified that error appears in the above-identified patent and that said Letters Patent is hereby corrected as shown below:

Title page,
Item [63], Related U.S. Application Data,
"application No. 09/353,197" should read -- application No. 09/353,196 --;
"application No. 09/353,796" should read -- application No. 09/353,197 --.

Column 1,
Line 8, "No. 09/353,796" should read -- No. 09/353,196 --.

Column 11,
Line 28, in the sub-heading, "INDUSTRRIAL" should read -- INDUSTRIAL --.

Signed and Sealed this

First Day of October, 2002

*Attest:*

JAMES E. ROGAN

*Attesting Officer*

*Director of the United States Patent and Trademark Office*